United States Patent
Matsuda et al.

(10) Patent No.: US 8,264,299 B2
(45) Date of Patent: Sep. 11, 2012

(54) BOUNDARY ACOUSTIC WAVE DEVICE AND COMMUNICATION EQUIPMENT

(75) Inventors: Satoru Matsuda, Kawasaki (JP); Michio Miura, Kawasaki (JP); Takashi Matsuda, Kawasaki (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 240 days.

(21) Appl. No.: 12/711,965

(22) Filed: Feb. 24, 2010

(65) Prior Publication Data

US 2011/0204994 A1  Aug. 25, 2011

Related U.S. Application Data

(63) Continuation of application No. PCT/JP2007/072406, filed on Nov. 19, 2007.

(51) Int. Cl.
*H03H 9/25* (2006.01)
*H03H 9/145* (2006.01)
(52) U.S. Cl. ............... 333/133; 333/195; 310/313 R
(58) Field of Classification Search ............. 333/133, 333/193, 194, 195, 196; 310/313 R
See application file for complete search history.

(56) References Cited

U.S. PATENT DOCUMENTS

| | | | | |
|---|---|---|---|---|
| 7,554,419 | B2* | 6/2009 | Inoue et al. | 333/26 |
| 7,564,174 | B2* | 7/2009 | Matsuda et al. | 310/346 |
| 2002/0038985 | A1 | 4/2002 | Iwamoto | |
| 2006/0175928 | A1 | 8/2006 | Kando | |
| 2007/0210676 | A1* | 9/2007 | Matsuda et al. | 310/326 |
| 2007/0278898 | A1 | 12/2007 | Miura et al. | |
| 2008/0129418 | A1* | 6/2008 | Miura et al. | 333/195 |
| 2009/0002097 | A1 | 1/2009 | Takamine | |

FOREIGN PATENT DOCUMENTS

| | | |
|---|---|---|
| EP | 2 015 451 A1 | 1/2009 |
| JP | 2002-043888 A | 2/2002 |
| JP | 2007-243473 A | 9/2007 |
| JP | 2007-329584 A | 12/2007 |
| WO | 98/52279 A1 | 11/1998 |
| WO | 2004/095699 A1 | 11/2004 |
| WO | 2007/116760 A1 | 10/2007 |

OTHER PUBLICATIONS

International Search Report (ISR) issued in PCT/JP2007/072406 mailed in Feb. 2008.

* cited by examiner

*Primary Examiner* — Dean O Takaoka
(74) *Attorney, Agent, or Firm* — Chen Yoshimura LLP

(57) ABSTRACT

A boundary acoustic waves device includes a piezoelectric substrate having piezoelectricity, interdigitated electrodes formed on the piezoelectric substrate, a first medium formed on the piezoelectric substrate so as to cover the interdigitated electrode, and a second medium formed on the first medium. The interdigitated electrodes include a plurality of electrode fingers and bus bars that connect ends of the plurality of electrode fingers. A third medium is formed on the first medium. The second medium and the third medium are in contact with the first medium. The first medium, the second medium, and the third medium are formed of different materials. The first medium, the second medium, and the third medium are different in a ratio in length of a part with the third medium formed with respect to a length of a propagation path of boundary acoustic waves in a cross-section perpendicular to a longitudinal direction of the electrode fingers, in the longitudinal direction of the electrode fingers.

11 Claims, 11 Drawing Sheets

BOUNDARY ACOUSTIC WAVE DEVICE AND COMMUNICATION EQUIPMENT

CROSS-REFERENCE TO RELATED APPLICATIONS

This application is a continuation of PCT International Application No. PCT/JP2007/072406, filed on Nov. 19, 2007, designating the United States, the entire contents of which are hereby incorporated by reference.

FIELD

The present application relates to a boundary acoustic waves device. The present application relates to communication equipment.

BACKGROUND

A surface acoustic wave (SAW) device has been known conventionally as one of the devices adopting an acoustic wave. The SAW device is used in various circuits that process radio signals in a frequency band of 45 MHz to 2 GHz typically in mobile telephones, for example. Examples of various circuits include a transmitting band-pass filter, a receiving band-pass filter, a local filter, an antenna duplexer, an IF filter, and an FM modulator.

Recently, a boundary acoustic waves device using boundary acoustic waves have been developed. International Publication No. WO98/52279 discloses a boundary acoustic waves device.

However, the above-mentioned boundary acoustic waves device has a problem that acoustic waves to be excited are generated at the boundary between a first medium and a second medium, for example, in addition to the boundary between a piezoelectric substrate and the first medium, and the acoustic wave influences the characteristics as an unnecessary response.

SUMMARY

A boundary acoustic waves device of the present application includes: a piezoelectric substrate having piezoelectricity; an interdigitated electrode formed on the piezoelectric substrate; a first medium formed on the piezoelectric substrate so as to cover the interdigitated electrode; and a second medium formed on the first medium, the interdigitated electrode having a plurality of electrode fingers and a bus bar that connects ends of the plurality of electrode fingers. The boundary acoustic waves device includes a third medium formed on the first medium. The second medium and the third medium are in contact with the first medium. The first medium, the second medium, and the third medium respectively are formed of different materials. A ratio in length of a part with the third medium formed with respect to a length of a propagation path of boundary acoustic waves in a cross-section perpendicular to a longitudinal direction of the electrode fingers varies in the longitudinal direction of the electrode fingers.

Additional objects and advantages of the invention (embodiment) will be set forth in part in the description which follows, and in part will be obvious from the description, or may be learned by practice of the invention. The object and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF EMBODIMENTS

Figure 1:
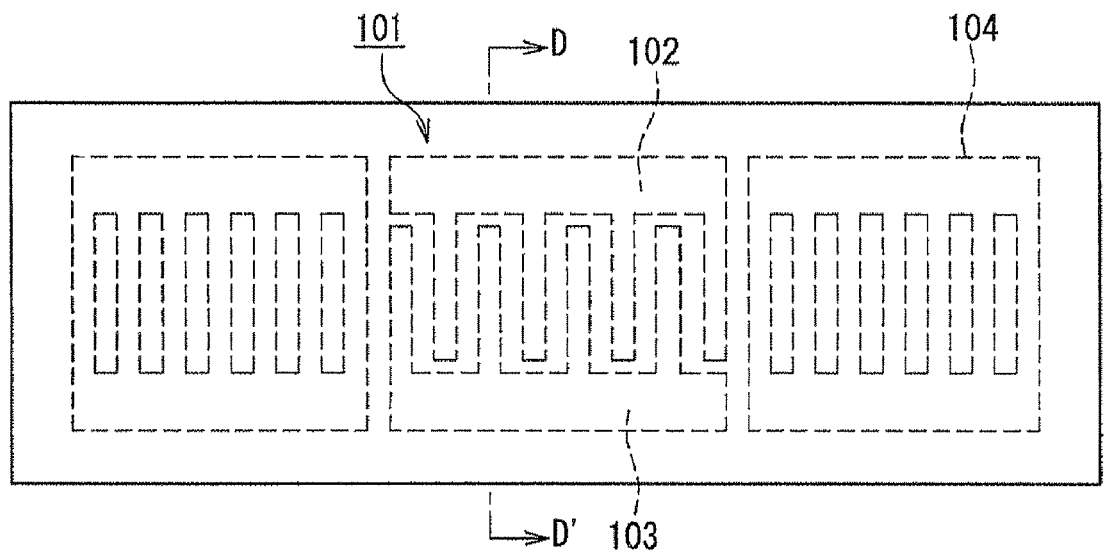
FIG. 1 is a plan view of a one-port resonator.

A boundary acoustic waves device of the present application includes: a piezoelectric substrate having piezoelectricity; an interdigitated electrode formed on the piezoelectric substrate; a first medium formed on the piezoelectric substrate so as to cover the interdigitated electrode; and a second medium formed on the first medium, the interdigitated electrode having a plurality of electrode fingers and a bus bar that connects ends of the plurality of electrode fingers. The boundary acoustic waves device includes a third medium formed on the first medium. The second medium and the third medium are in contact with the first medium. The first medium, the second medium, and the third medium respectively are formed of different materials. A ratio in length of a part with the third medium formed with respect to a length of a propagation path of boundary acoustic waves in a cross-section perpendicular to a longitudinal direction of the electrode fingers varies in the longitudinal direction of the electrode fingers.

In the boundary acoustic waves device, the third medium can be formed of a material different from that of the second medium in a propagation speed of an acoustic wave. According to this configuration, the propagation speed of boundary acoustic waves propagating through the boundary between the first medium and the second medium is different from that of boundary acoustic waves propagating through the boundary between the first medium and third medium, and two resonant frequencies are generated in an unnecessary response. Consequently, the magnitude of the unnecessary response can be reduced.

The boundary acoustic waves device can also be configured so that the first medium is divided into halves in a direction perpendicular to the longitudinal direction of the electrode fingers, as a region on which the third medium is formed and a region on which the third medium is not formed. According to such a configuration, an unnecessary response can be divided into two equally, which can reduce the magnitude of the unnecessary response.

The boundary acoustic waves device may have a configuration in which the third medium is formed in a plural number. The production precision is enhanced by dividing the third medium into a plural number.

In the boundary acoustic waves device, the ratio in length of the part with the third medium formed with respect to the length of the propagation path of the boundary acoustic waves in the cross-section perpendicular to the longitudinal direction of the electrode fingers may vary continuously in the longitudinal direction of the electrode fingers. According to this configuration, the magnitude of an unnecessary response can be reduced.

In the boundary acoustic waves device, the third medium may be formed of at least two media that are formed of different materials. According to this configuration, the propagation speeds of boundary acoustic waves at respective boundaries between at least two different media and the first medium are different, and frequencies at which unnecessary responses are generated are different. Thus, an unnecessary response becomes characteristics having at least two peaks, whereby the maximum value of an insertion loss caused by the unnecessary response can be reduced.

In the boundary acoustic waves device, the first medium may be $SiO_2$, and the third medium may be alumina or SiN. Temperature-compensating characteristics can be rendered satisfactory by using $SiO_2$ for the first medium. In the boundary acoustic waves device, the propagation speed of boundary acoustic waves propagating through the boundary between the first medium and the third medium can be enhanced by using alumina or SiN for the third medium.

Further, in the acoustic boundary device, the piezoelectric substrate may be $LiTaO_3$ or $LiNbO_3$.

A filter includes a one-port resonator. According to this configuration, the leakage of a signal caused by an unnecessary response of the boundary acoustic waves device can be reduced.

A filter includes a double-mode resonator. According to this configuration, the leakage of a signal caused by an unnecessary response of the boundary acoustic waves device can be reduced.

Embodiment 1

Figure 2:
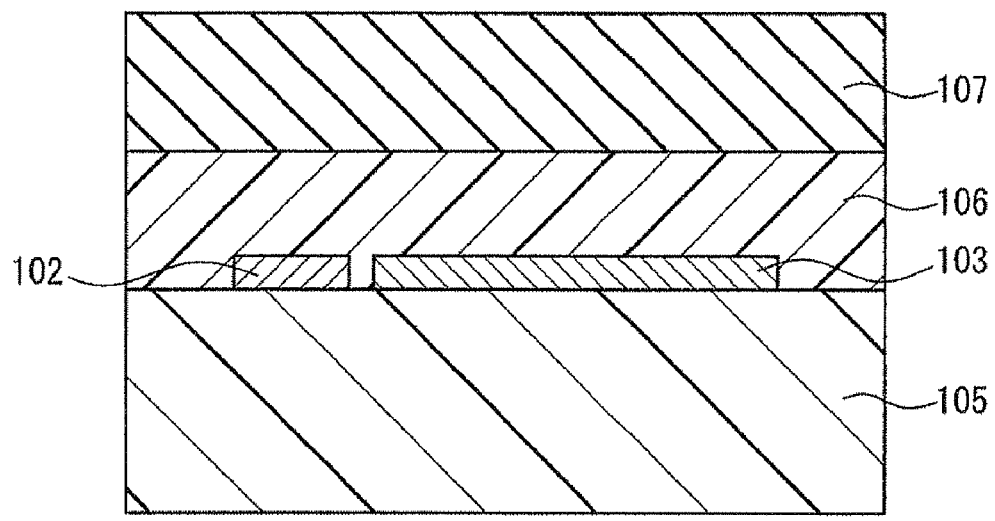
FIG. 2 is a cross-sectional view taken along a line D-D' in FIG. 1.

FIG. 1 is a plan view illustrating a configuration of a resonator that is a boundary acoustic waves device. FIG. 2 is a cross-sectional view taken along a line D-D' in FIG. 1. A resonator part 101 and reflectors 104 are formed on a piezoelectric substrate 105. The resonator part 101 includes two interdigitated electrodes 102, 103. A first medium 106 is formed on the resonator part 101 and the reflectors 104. A second medium 107 is formed on the first medium 106.

When an AC voltage is applied between the interdigitated electrodes 102 and 103, boundary acoustic waves are generated between the piezoelectric substrate 105 and the first medium 106, and the boundary acoustic waves generate, in turn, a voltage in the interdigitated electrodes 102, 103. However, the above-mentioned boundary acoustic waves device has a problem that an acoustic wave to be excited is generated at the boundary between the first medium and the second medium, for example, in addition to the boundary between the piezoelectric substrate and the first medium, and the acoustic wave influences the characteristics as an unnecessary response.

Figure 3:
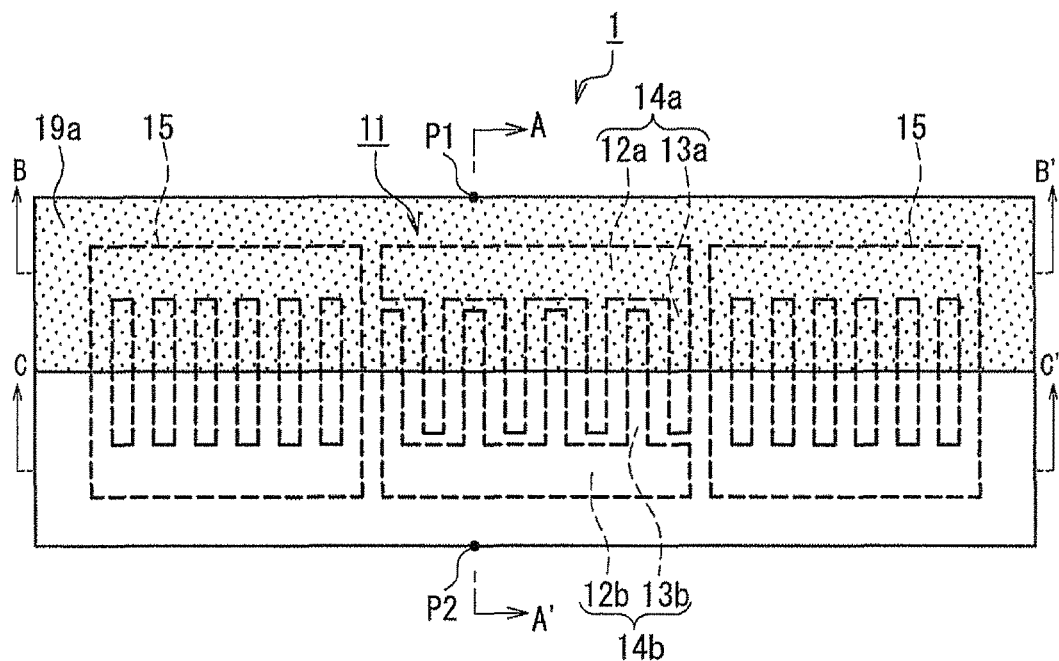
FIG. 3 is a plan view of a one-port resonator according to Embodiment 1.
Figure 4:
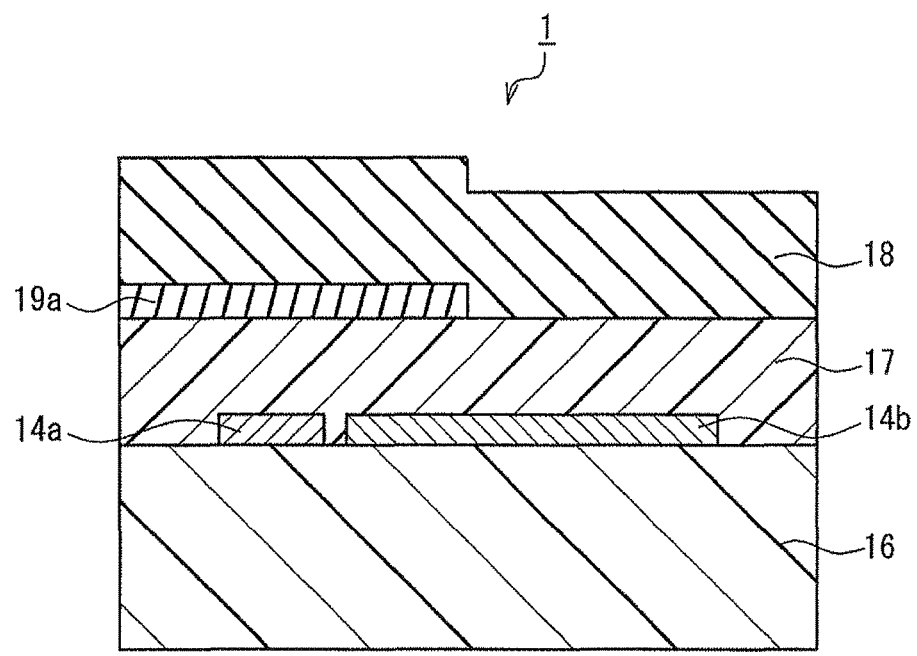
FIG. 4 is a cross-sectional view taken along a line A-A' in FIG. 3.

FIG. 3 is a plan view of the boundary acoustic waves device according to Embodiment 1. The boundary acoustic waves device illustrated in FIG. 3 is, for example, a one-port resonator. FIG. 2 is a cross-sectional view taken along a line A-A' in FIG. 3. In FIG. 3, in order to clarify the position where a third medium 19a is formed, a second medium 18 illustrated in FIG. 2 is omitted, and the third medium 19a is hatched. Further, FIG. 3 illustrates the interdigitated electrodes 14a, 14b and reflectors 15 with broken lines so as to make the shape of the interdigitated electrodes easy to understood.

A piezoelectric substrate 16 is formed of lithium niobate ($LiNbO_3$) of 30 Y-cut X-propagation. The piezoelectric substrate 16 preferably has a large electromechanical coupling coefficient $k^2$, and also can use lithium tantalate ($LiTaO_3$) in place of $LiNbO_3$. A resonator part 11 and the reflectors 15 are formed on the piezoelectric substrate 16. The reflectors 15 are placed on both sides of the resonator part 11 and are formed of gratings. The resonator part 11 includes two interdigitated electrodes 14a, 14b placed opposed to each other. The interdigitated electrodes 14a, 14b include a plurality of electrode fingers 13a, 13b and bus bars 12a, 12b. The electrode fingers 13a are connected to the bus bar 12a. The electrode fingers 13b are connected to the bus bar 12b. The electrode finger 13a is placed so as to be interposed between two electrode fingers 13b. The interdigitated electrodes 14a, 14b and the reflectors 15 contain copper (Cu) as a main component, and are formed with a thickness of 170 nm. In FIGS. 1 and 2, for the purpose of illustration, some electrode fingers are omitted. The propagation path of boundary acoustic waves includes a region from the interdigitated electrode at one end to the interdigitated electrode at the other end on a straight line connecting the two reflectors 15.

A first medium 17 is formed on the interdigitated electrodes 14a, 14b and the reflectors 15. The first medium 17 is formed of $SiO_2$ in order to compensate for temperature characteristics. If the wavelength of a propagating acoustic wave is λ, the thickness of the first medium 17 preferably is about 0.1λ to 1λ, and can be, for example, 1,050 nm. In the one-port resonator, main boundary acoustic waves propagate between the piezoelectric substrate 16 and the first medium 17. The third medium 19a is formed in a part on the first medium 17. The third medium 19a has a thickness of 100 nm.

The third medium 19a is formed of a material (for example, titanium (Ti)) in which the speed of a propagating acoustic wave is higher than that of the first medium 17. As illustrated in FIG. 1, the third medium 19a is formed in one of the regions obtained by dividing the region of the one-port resonator into halves in a direction perpendicular to the longitudinal direction of the electrode fingers 13a in the region where the first medium 17 is formed. The second medium 18 is formed on the first medium 17 in which the third medium 19a is not formed and on the third medium 19a. The second medium 18 is formed of $Al_2O_3$ (alumina) with a thickness of 2 μm.

The second medium 18 is formed of a material in which the propagation speed of an acoustic wave is higher than that of the first medium 17 and is different from that of the third medium 19a. The second medium 18 can use silicon (Si), silicon nitride (SiN), or the like, in place of aluminum oxide ($Al_2O_3$) having a high propagation speed. In the one-port resonator, secondary boundary acoustic waves that cause an unnecessary response as described later propagates through the boundary between the first medium 17 and the second medium 18, the boundary between the first medium 17 and the third medium, and the like.

Figure 5:
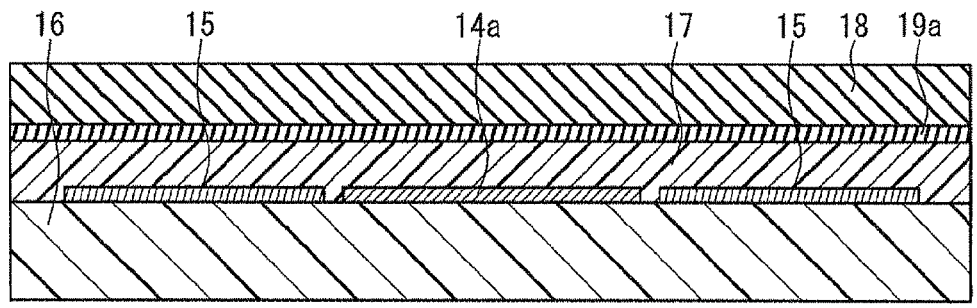
FIG. 5 is a cross-sectional view taken along a line B-B' in FIG. 3.

FIG. 5 is a cross-sectional view taken along a line B-B' in FIG. 1. On the line B-B', the third medium 19a is formed on the first medium 17. That is, a ratio in length of a region in which the third medium 19a is formed (hereinafter, referred to as a formation ratio of the third medium) with respect to the length of the propagation path of secondary boundary acoustic waves on the line B-B' is 100%.

Figure 6:
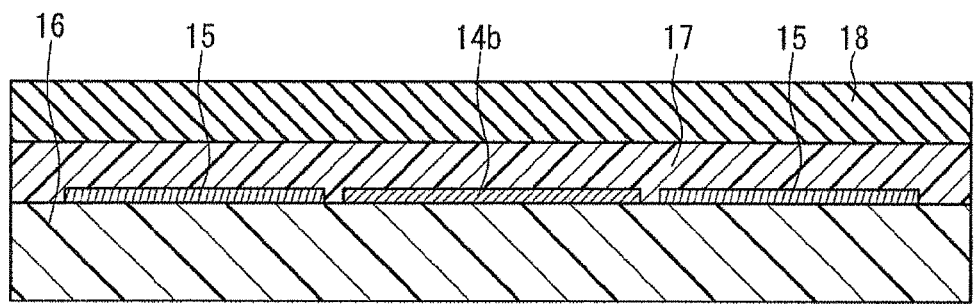
FIG. 6 is a cross-sectional view taken along a line C-C' in FIG. 3.

FIG. 6 is a cross-sectional view taken along a line C-C' in FIG. 1. On the line C-C', the third medium 19a is not formed on the first medium 17. That is, the formation ratio of the third medium on the line C-C' is 0%.

Figure 7:
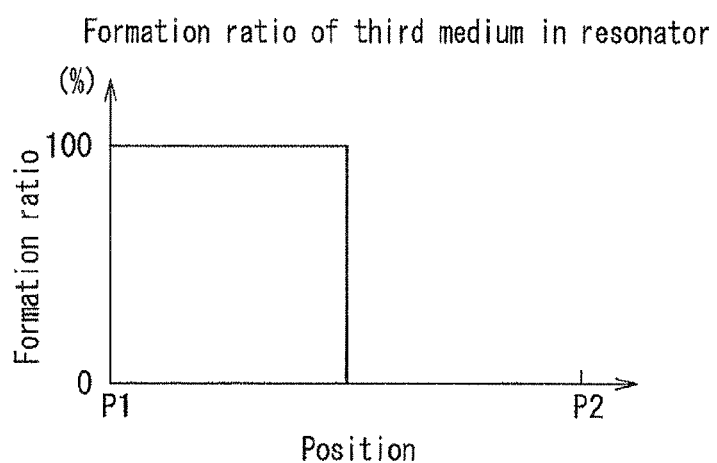
FIG. 7 is a graph illustrating a formation ratio of a third medium in the resonator according to Embodiment 1.

FIG. 7 is a graph illustrating the formation ratio of the third medium 19a in a direction parallel to the line B-B' in FIG. 1. A horizontal axis in FIG. 7 represents a position between positions P1 and P2 in the A-A' direction. In the direction perpendicular to the A-A' direction (propagation path direction), there are a region where the formation ratio of the third medium 19a is 100% and a region where the formation ratio of the third medium 19a is 0%.

That is, two kinds of a propagation path (first path) that is the boundary between the first medium 17 and the second medium 18 and a propagation path (second path) that is the boundary between the first medium 17 and the third medium 19a are formed, with respect to boundary acoustic waves. The second path has a width that is a half of that of a conventional resonator due to the presence of the first path. Since the second medium 18 is different from the third medium 19a in the propagation speed of an acoustic wave, the propagation speed at which boundary acoustic waves propagate through the first path is different from the propagation speed at which boundary acoustic waves propagate through the second path. Further, the wavelength of the boundary acoustic waves propagating through the first path is the same as the wavelength of the boundary acoustic waves propagating through the second path, since they are determined depending upon the length between the interdigitated electrodes. Thus, the boundary acoustic waves propagating through the first path are different from the boundary acoustic waves propagating through the second path in a resonant frequency.

Figure 8A:
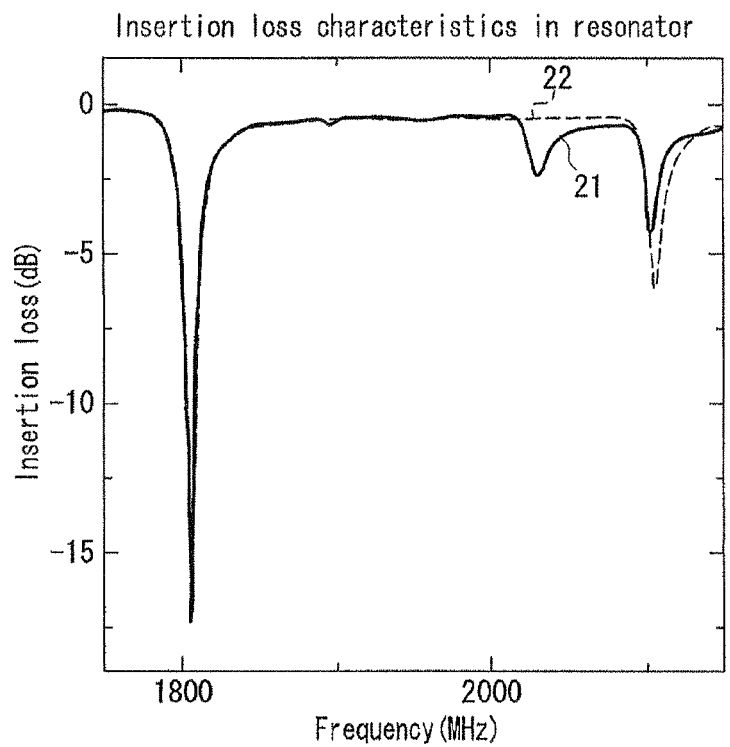
FIG. 8A is a graph illustrating insertion loss characteristics in the resonator according to Embodiment 1.
Figure 8B:
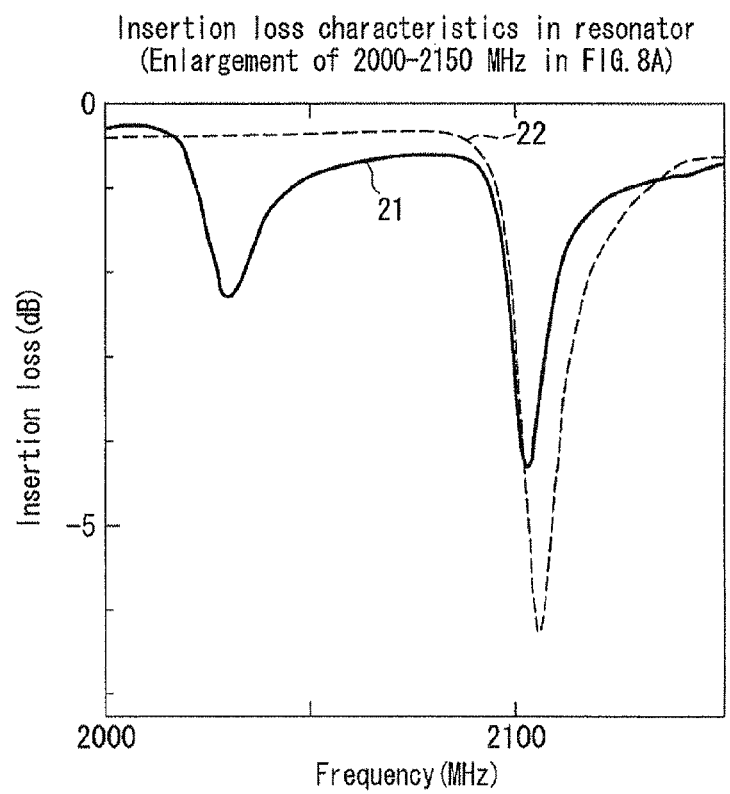
FIG. 8B is a graph obtained by enlarging the graph in FIG. 8A.

FIG. 8A is a graph illustrating frequency characteristics of an insertion loss (insertion loss characteristics) in a resonator 1 according to the present embodiment. FIG. 8B is a graph obtained by enlarging a region with a frequency of 2000 MHz to 2150 MHz in the graph illustrated in FIG. 8A. An insertion loss curve 21 is a curve representing the insertion loss characteristics of the resonator 1. Broken lines in FIGS. 8A and 8B indicate an insertion loss curve 22 representing the insertion loss characteristics in a resonator in which the third medium is not provided.

As illustrated in FIG. 8A, a portion in which an insertion loss is large at 1805 MHz in the insertion loss curves 21 and 22 corresponds to a desired response by the boundary acoustic waves propagating through the boundary between the piezoelectric substrate 16 and the first medium 17. A frequency in the portion in which the loss is large in the insertion loss curves 21 and 22 is an antiresonant frequency. In the insertion loss curves 21 and 22, a Q-value of an antiresonance is better as a pull-in amount is larger. As illustrated in FIG. 8B, the insertion loss curve 21 includes an unnecessary response at 2030 MHz, in addition to the unnecessary response at 2105 MHz represented in the insertion loss curve 22. The unnecessary response at 2030 MHz is generated by the boundary acoustic waves propagating through the second path. That is, in the insertion loss curve 21, the unnecessary response at 2105 MHz is shifted to 2030 MHz by the boundary acoustic waves propagating through the second path with respect to the unnecessary response at 2105 MHz represented in the insertion loss curve 22.

The insertion loss curve 21 includes the unnecessary response at 2030 MHz. However, the maximum value of the insertion loss is smaller by about 60%, compared with the maximum value of the insertion loss by the unnecessary response at 2105 MHz in the insertion loss curve 22. Further, in the insertion loss curve 21, the maximum value of the insertion loss by the unnecessary response at 2105 MHz is reduced by about 40%, which corresponds to the unnecessary response generated at 2030 MHz. Thus, the maximum value of the insertion loss by the unnecessary response is reduced.

Embodiment 2

Figure 9:
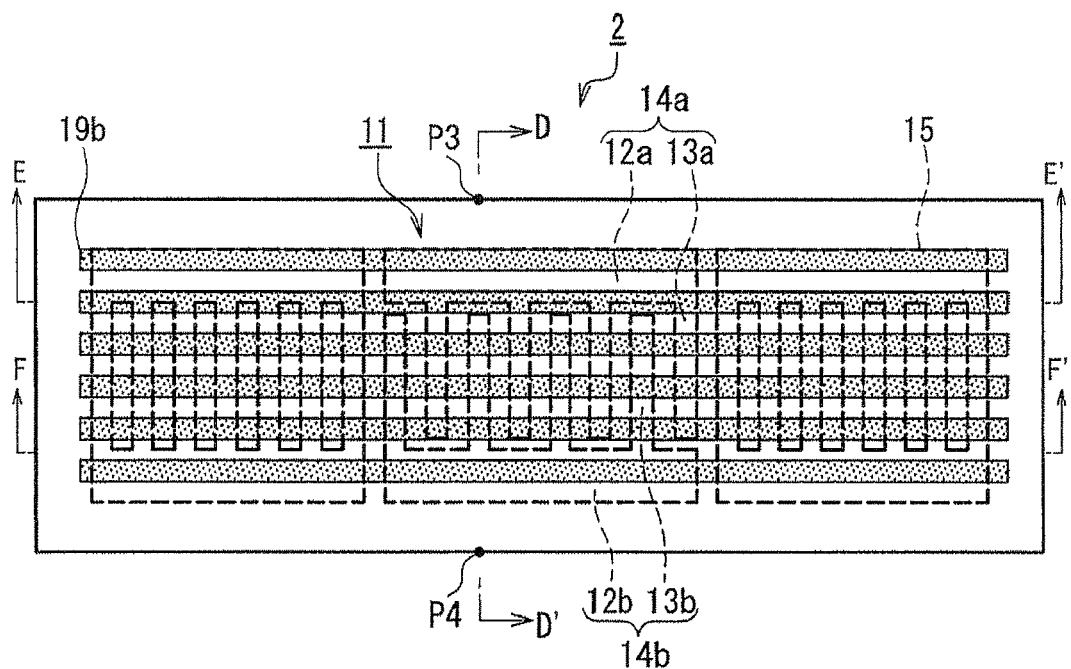
FIG. 9 is a plan view of a one-port resonator according to Embodiment 2.
Figure 10:
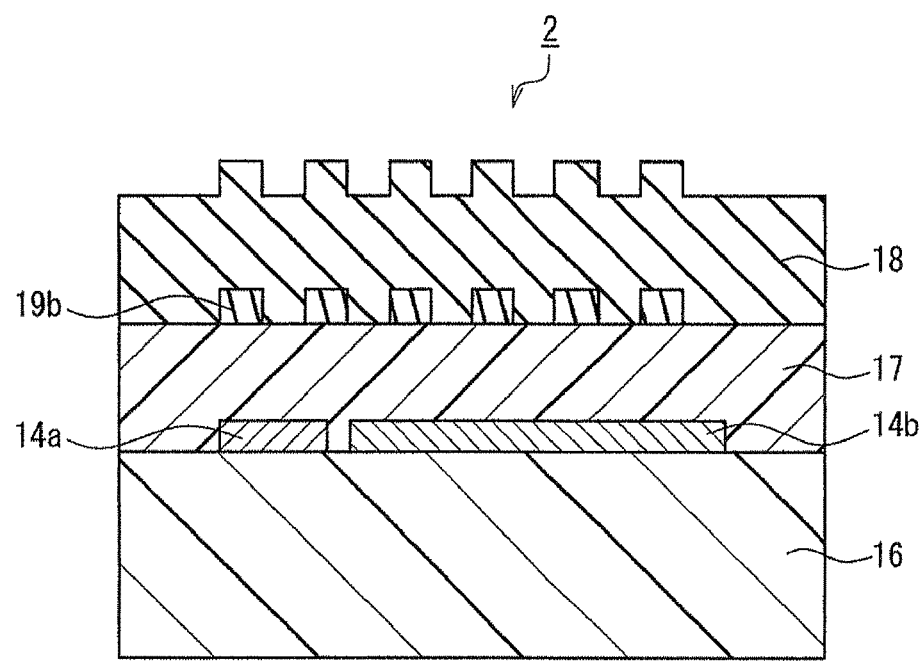
FIG. 10 is a cross-sectional view taken along a line D-D' in FIG. 9.

FIG. 9 is a plan view of a one-port resonator 2 according to Embodiment 2. FIG. 10 is a cross-sectional view taken along a line D-D' in FIG. 9. In FIG. 9, in order to clarify the position where third media 19b are formed, a second medium 18 illustrated in FIG. 10 is omitted and the third media 19b are hatched. Further, in FIG. 9, interdigitated electrodes 14a, 14b and reflectors 15 are illustrated with broken lines. The resonator 2 according to the present embodiment is different from the resonator 1 according to Embodiment 1, merely in the shape of the third media 19b. The same constituent elements as those of the resonator 1 according to Embodiment 1 are denoted with the same reference numerals as those therein, and the descriptions thereof will be omitted.

The third media 19b have a rectangular solid shape (the third media 19b may have a shape close to a rectangular solid shape with a tapered portion formed). The third media 19b are formed in a plural number. The third media 19b are arranged so that the longitudinal direction thereof is matched with the propagation direction (horizontal direction in the figure) of boundary acoustic waves. The respective third media 19b are placed at a predetermined interval.

In a cross-section taken along a line E-E' in FIG. 9, the third medium 19b is formed on a first medium 17 in the same way as in the third medium 19a in the cross-sectional view illustrated in FIG. 5. That is, a ratio in length of a region where the third medium 19b is formed (formation ratio of the third medium) is 100% with respect to the length of the propagation path of secondary boundary acoustic waves of the line E-E'.

In a cross-section taken along a line F-F' in FIG. 9, the third medium 19a is not formed on the first medium 17 in the same way as in the cross-sectional view illustrated in FIG. 6. That is, the formation ratio of the third medium 19b on the line F-F' is 0%.

Figure 11:
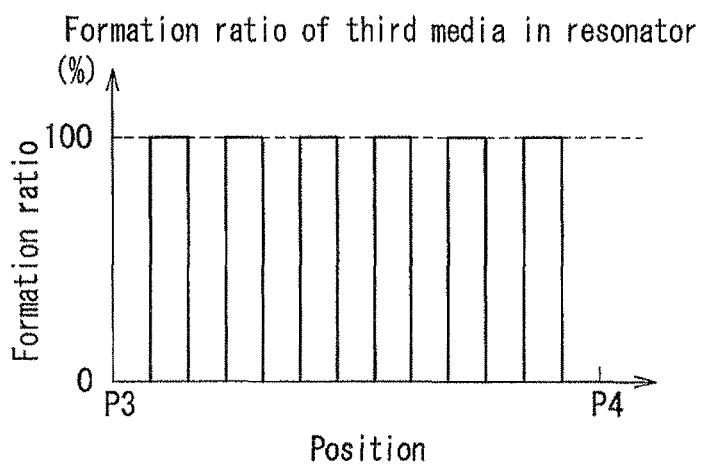
FIG. 11 is a graph illustrating a formation ratio of a third medium in the resonator according to Embodiment 2.

FIG. 11 is a graph illustrating the formation ratio of the third media 19b in a direction (propagation direction of boundary acoustic waves) perpendicular to the D-D' direction in FIG. 9. A horizontal axis in FIG. 11 represents a position between positions P3 and P4 in the D-D' direction. As illustrated in FIG. 11, a region where the formation ratio of the third medium 19b is 100% and a region where the formation ratio of the third medium 19b is 0% are formed alternately. More specifically, a propagation path (first path) that is the boundary between the first medium 17 and the second medium 18 and a propagation path (second path) that is the boundary between the first medium 17 and the third media 19b are formed with respect to a boundary wave.

Figure 12:
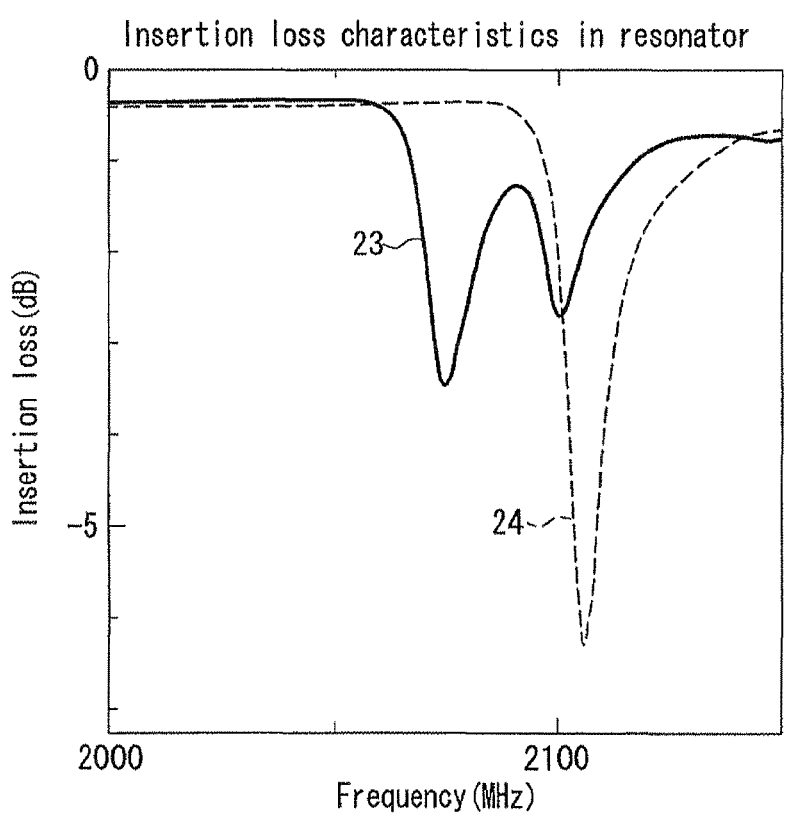
FIG. 12 is a graph illustrating insertion loss characteristics in the resonator according to Embodiment 2.

FIG. 12 is a graph illustrating frequency characteristics of an insertion loss (insertion loss characteristics) in the resonator 2 according to the present embodiment. The insertion loss curve 23 is a curve representing the insertion loss characteristics of the resonator 2. Broken lines in FIGS. 12A and 12B indicate an insertion loss curve 24 representing the frequency characteristics of an insertion loss in a resonator in which the third medium is not provided.

As illustrated in FIG. 12, in the insertion loss curve 23, unnecessary responses having two peaks at 2075 MHz and 2100 MHz are generated in place of the unnecessary response at 2105 MHz generated in the insertion loss curve 24. The unnecessary response at 2075 MHz in the insertion loss curve 23 is generated in the second path. On the other hand, the unnecessary response at 2100 MHz is generated by the first path.

The propagation path that used to be only the first path is divided into two kinds of paths, whereby the width of the first path becomes smaller by the second path. Thus, boundary acoustic waves propagating through the first path are reduced. The width of the second path is smaller than that of the first path. Thus, boundary acoustic waves propagating through the second path are less than those propagating through the first path. Therefore, the insertion losses at 2075 MHz and 2100 MHz respectively are reduced by about 50% to 60%, compared with the maximum value in the insertion loss curve 24.

Figure 13:
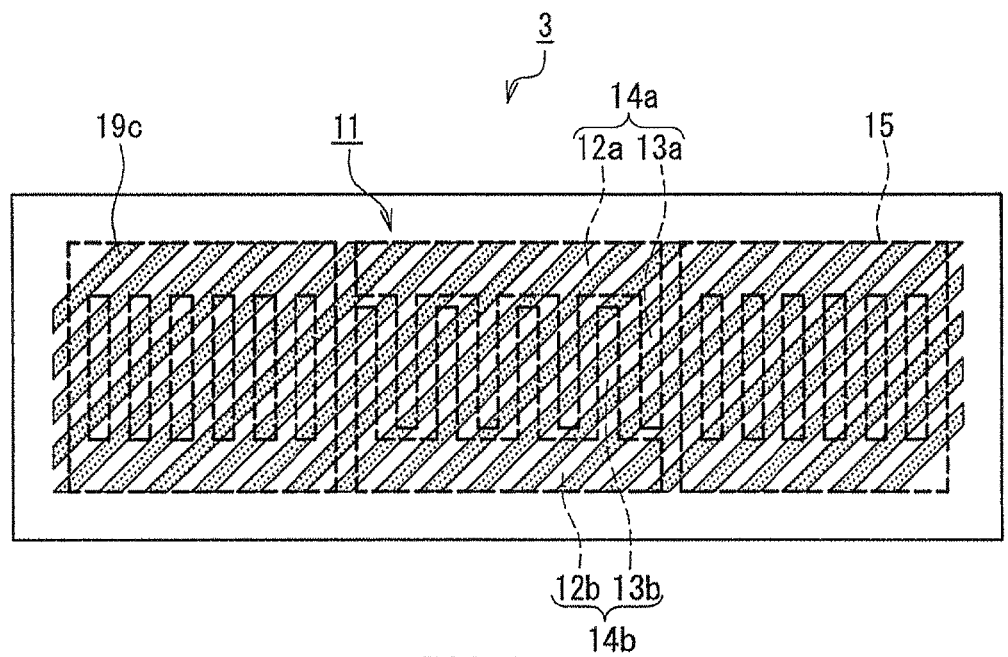
FIG. 13 is a plan view of a comparative example of the one-port resonator according to Embodiment 2.

FIG. 13 is a plan view of a resonator 3 (comparative example). The resonator 3 illustrated in FIG. 13 is a comparative example with respect to the resonator 2 according to the present embodiment. The resonator 3 is illustrated in FIG. 13 with the second medium omitted, and third media 19c are hatched. Further, FIG. 13 illustrates interdigitated electrodes 14a, 14b and reflectors 15 with broken lines. The resonator 3 is the same as the resonator 2 according to the present embodiment in that a plurality of the third media 19c in a rectangular solid shape are arranged. However, the resonator 3 is different from the resonator 2 according to the present embodiment in that the longitudinal direction of the third media 19c tilts at 45° from the propagation direction (horizontal direction in FIG. 13) of boundary acoustic waves.

Figure 14:
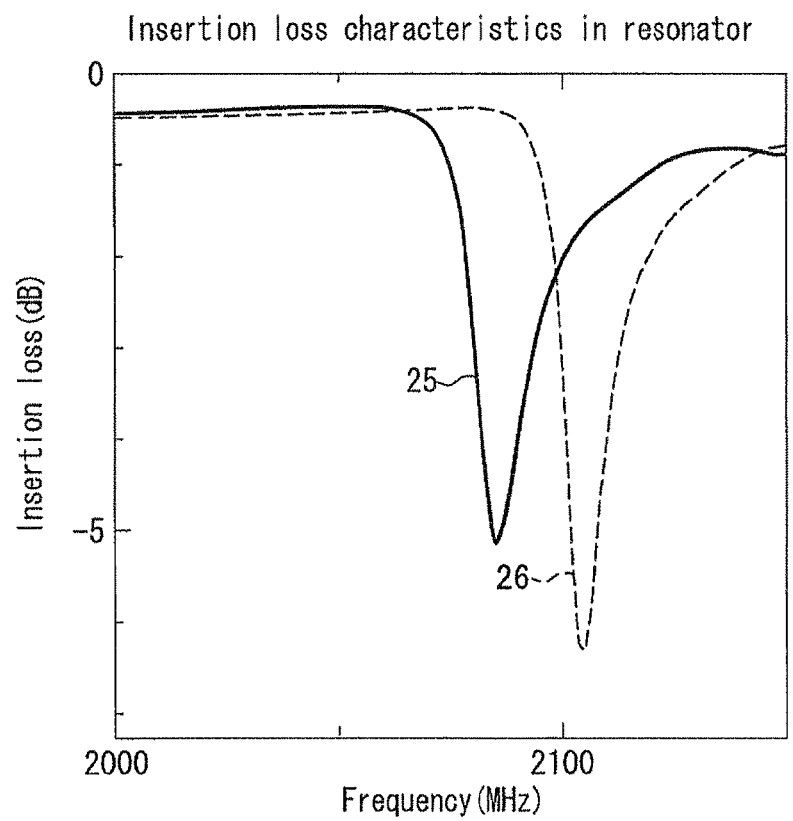
FIG. 14 is a graph obtained by enlarging insertion loss characteristics in the resonator according to Embodiment 2.

FIG. 14 is a graph illustrating insertion loss characteristics in the resonator 3. The formation ratio of the third media 19c in the propagation direction of boundary acoustic waves is 50% in any propagation path, if the width of the third medium 19c is the same as an interval between two adjacent third media 19c. That is, no difference is caused in the propagation speed of boundary acoustic waves whichever path the boundary acoustic waves propagates through. Therefore, the unnecessary response is not divided into two, and the maximum value of the insertion loss of an unnecessary response is reduced only by 20% from the maximum value of the insertion loss of an unnecessary response in conventional insertion loss characteristics.

As descried above, the third media 19b are formed so that the formation ratio thereof varies depending upon the propagation path, whereby an unnecessary response is divided into at least two, and the maximum value of the insertion loss of the unnecessary response is reduced.

Embodiment 3

Figure 15:
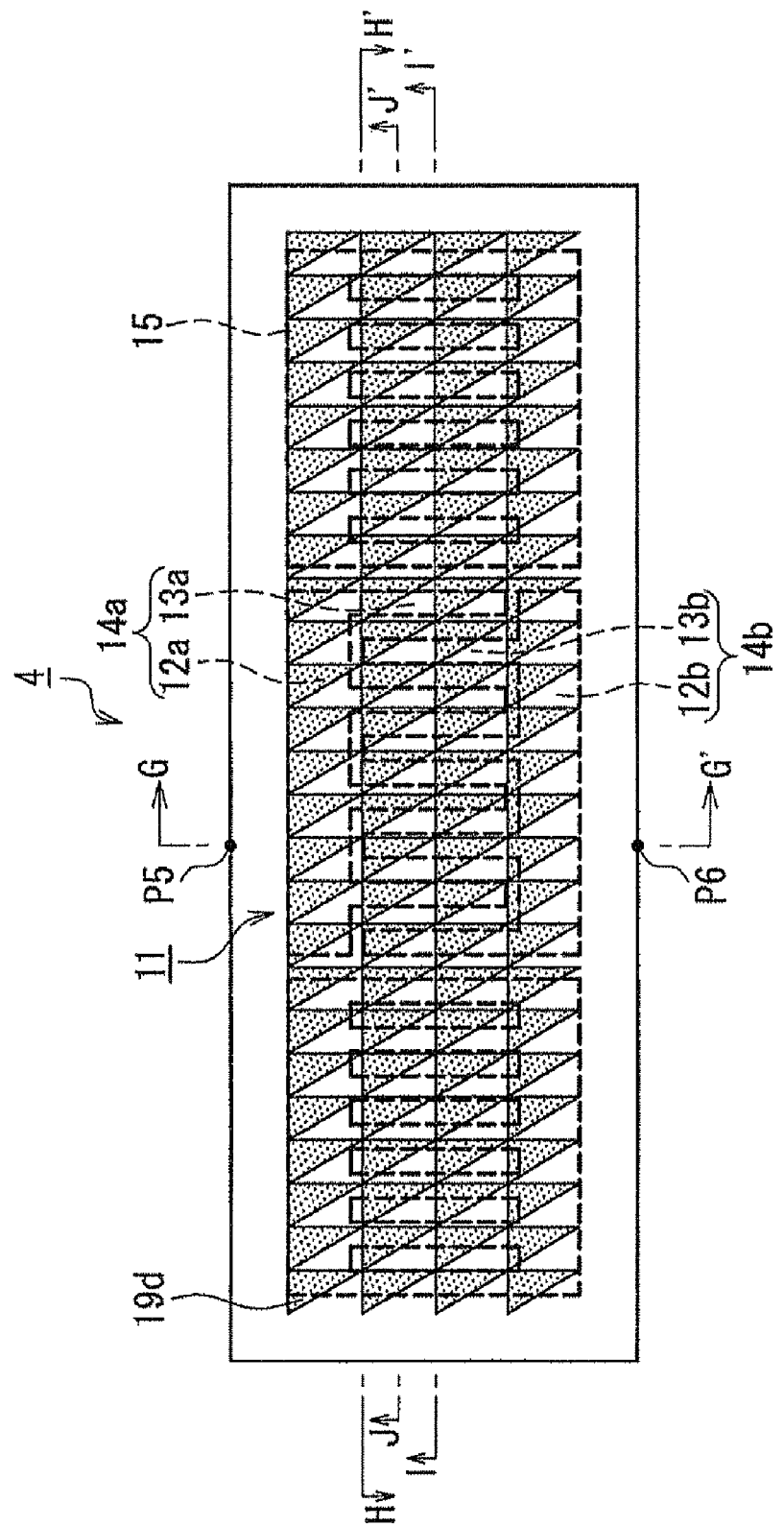
FIG. 15 is a plan view of a one-port resonator according to Embodiment 3.

FIG. 15 is a plan view of a resonator 4 according to Embodiment 3. In FIG. 15, in order to clarify the position where third media 19d are formed, a second medium is omitted and the third media 19d are hatched. Further, in FIG. 15, interdigitated electrodes 14a, 14b and reflectors 15 are illustrated with broken lines. A resonator 4 according to the present embodiment is different from the resonator 1 according to Embodiment 1 only in the shape of the third media 19d. The same constituent elements as those of the resonator 1 according to Embodiment 1 are denoted with the same reference numerals as those therein, and the descriptions thereof will be omitted.

The third media 19d have a shape in which a plurality of medium portions in a triangular prism shape are provided. Thus, as illustrated in FIG. 15, the planar shape of each medium portion of the third media 19d is a triangle. A side on which two side faces are in contact with each other in the medium portion included in the third media 19d is in contact with a side on which two side faces are in contact with each other in another medium portion. Although the third media 19d have a triangular prism shape in the present embodiment, strictly, they have a shape close to a triangular prism due to tapering.

On a line H-H' in FIG. 15, the third media 19d are formed on the first medium 17. That is, a ratio in length of a region where the third media 19d are formed (formation ratio of the third media) is 100% with respect to the length of a propagation path of secondary boundary acoustic waves of the line H-H' in FIG. 15.

On a line I-I' in FIG. 15, the third media 19d are not formed on the first medium 17. That is, the formation ratio of the third media 19d on the line I-I' in FIG. 15 is 0%.

Figure 16:
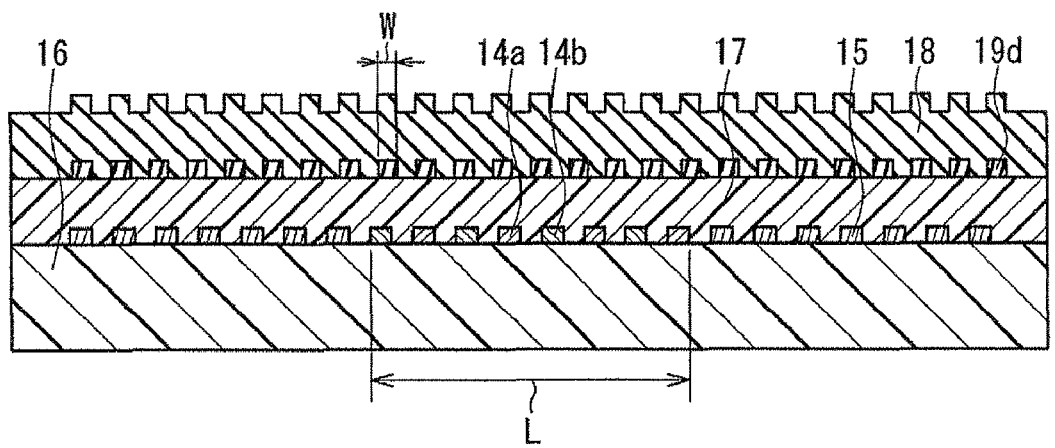
FIG. 16 is a cross-sectional view illustrating a cross-section taken along a line J-J' in FIG. 15.

FIG. 16 is a cross-sectional view taken along a line J-J' in FIG. 15. On the line J-J' in FIG. 15, there is a region where the third media 19d are formed and a region where the third media 19d are not formed, on the first medium 17. Assuming that the length of the propagation path of boundary acoustic waves is L, the length of the third media 19d in one section is W, and the number of the third media 19d in one section formed on the propagation path of boundary acoustic waves is N, the formation ratio M of the third media 19d is expressed by:

$$M = (N \times W/L) \times 100 (\%).$$

Thus, the propagation speed of boundary acoustic waves propagating on the line J-J' in FIG. 15 is between the propagation speed of boundary acoustic waves propagating on the line H-H' in FIG. 15 and the propagation speed of boundary acoustic waves propagating on the line I-I' in FIG. 15. Therefore, the frequency of an unnecessary response to be generated in the resonator 4 is between the frequency of an unnecessary response by boundary acoustic waves propagating on the line I-I' in FIG. 15 and the frequency of an unnecessary response by boundary acoustic waves propagating on the line J-J' in FIG. 15.

As the line J-J' illustrated in FIG. 15 approaches the line H-H', the length W of the third media 19d illustrated in FIG. 16 increases and the formation ratio M of the third media 19d increases. As the line J-J' approaches the line I-I', the length W of the third media 19d decreases and the formation ratio M of the third media 19d decreases.

Figure 17:
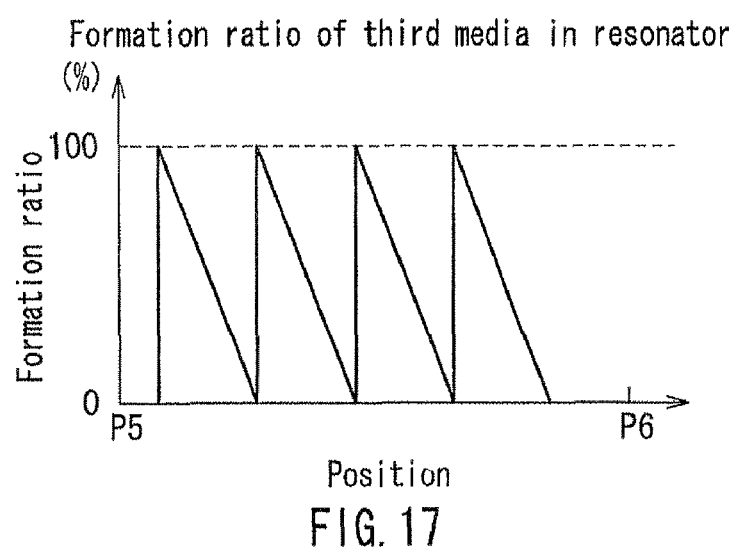
FIG. 17 is a graph illustrating a formation ratio of third media in the resonator according to Embodiment 3.

FIG. 17 is a graph illustrating the formation ratio of the third media 19d in the propagation path in the G-G' direction in FIG. 15. A horizontal axis in FIG. 17 represents a position between positions P5 and P6 in FIG. 15. As illustrated in FIG.

17, the formation ratio of the third media 19d changes continuously from the region (on the line H-H') where the formation ratio is 100% to the region (on the line I-I') where the formation ratio is 0%.

Figure 18:
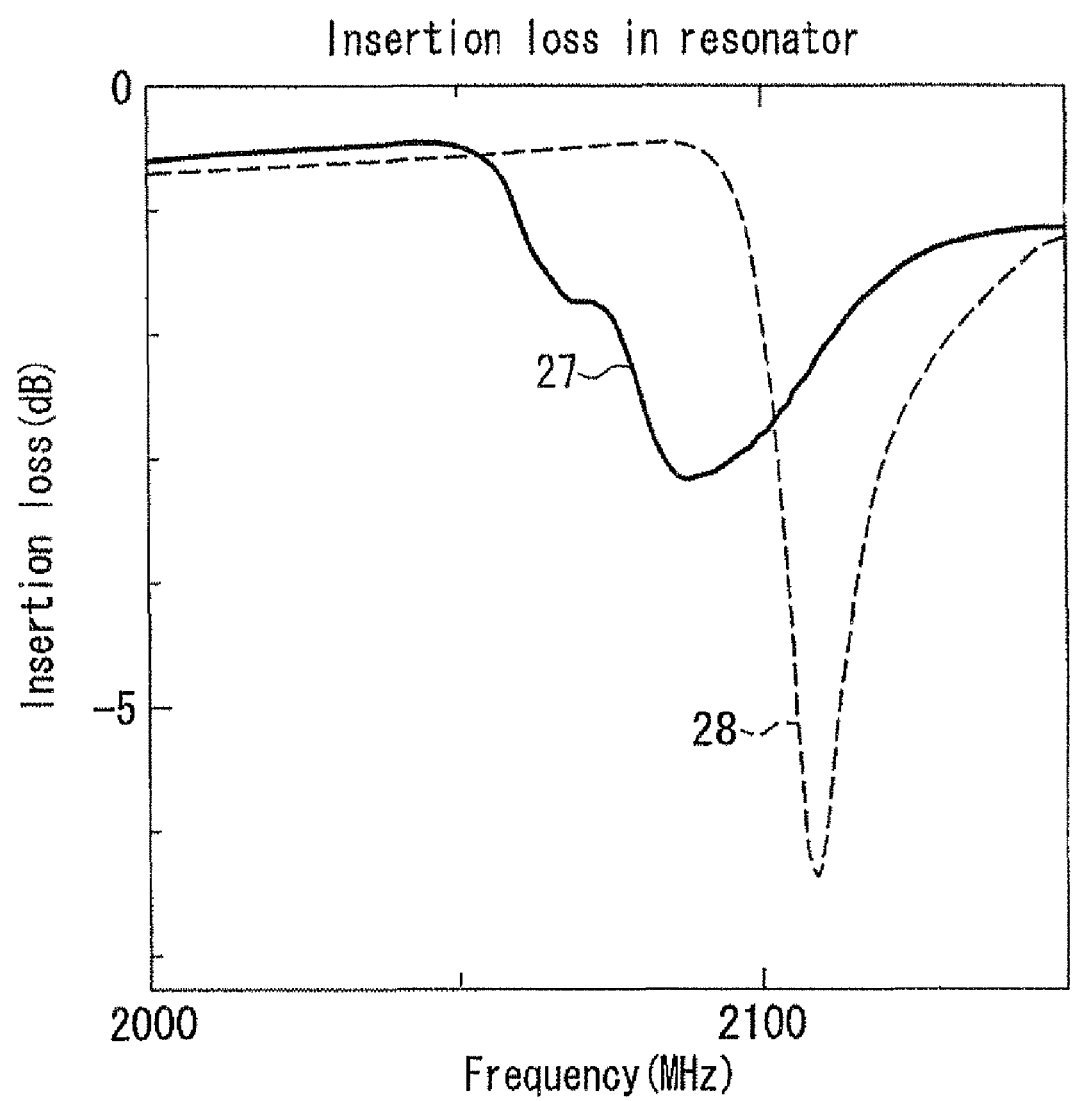
FIG. 18 is a graph obtained by enlarging insertion loss characteristics in the resonator according to Embodiment 3.

FIG. 18 is a graph illustrating frequency characteristics of an insertion loss (insertion loss characteristics) 27 in the resonator according to the present embodiment. FIG. 18 is a graph obtained by enlarging the region with a frequency of 2000 to 2150 MHz. The insertion loss curve 27 represents insertion loss characteristics of the resonator 4. An insertion loss curve 28 represents the frequency characteristics of an insertion loss in a resonator in which the third medium is not provided.

The insertion loss curve 28 includes an unnecessary response at around 2105 MHz. On the other hand, the insertion loss curve 27 (the resonator 4 of the present embodiment) includes a smooth unnecessary response in a frequency band from 2050 MHz to 2150 MHz. The reason for this is that the formation ratio of the third media 19d changes continuously in the propagation path of a boundary wave in the resonator 4. This allows a number of paths having different propagation speeds of a boundary wave to be formed in the resonator 4. Thus, the frequency characteristics become those in which unnecessary responses having peak frequencies that are slightly different from each other are superimposed. As illustrated in FIG. 18, at around 2090 MHz, which is a peak of an unnecessary response of the insertion loss curve 27, the insertion loss is reduced by about 50%, compared with the insertion loss of the insertion loss curve 28.

As represented by the insertion loss curve 27 in FIG. 18, the maximum value of an insertion loss of an unnecessary response becomes smaller, whereby the influence on a signal by an unnecessary response can be decreased.

In the present embodiment, the third media 19d are configured in such a manner that a number of medium portions in a triangular prism shape with a relatively small bottom face are arranged. However, the third media 19d may have a triangular prism shape with a relatively large bottom face, as long as the formation ratio of the medium portions in the propagation direction of boundary acoustic waves change continuously. Further the shape of the medium portion of the third media 19d may be a quadratic prism or other shapes, instead of the triangular prism.

Further, in Embodiments 1 to 3, although examples in which the resonator is a one-port resonator have been described, the same effects as those obtained in Embodiments 1 to 3 can be obtained by applying the configurations illustrated in Embodiments 1 to 3 to a double-mode resonator.

Embodiment 4

Figure 19:
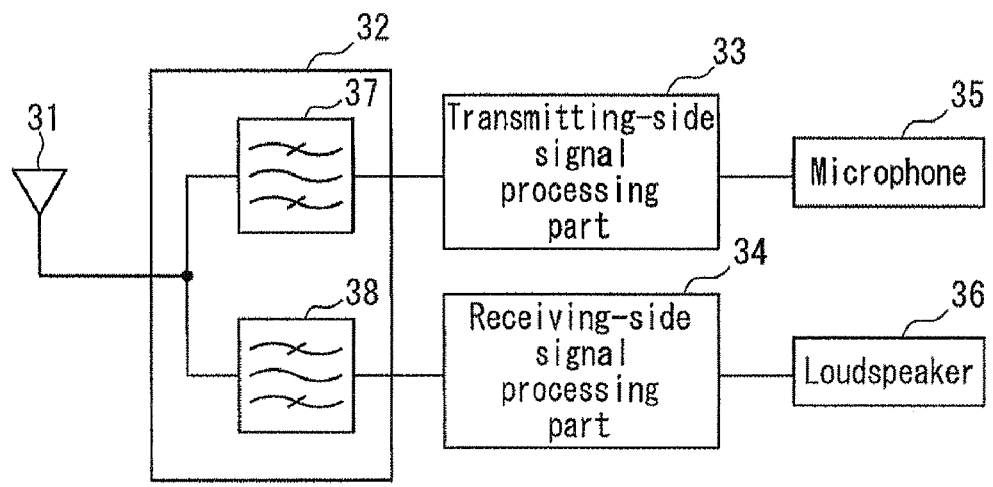
FIG. 19 is a block diagram of communication equipment according to Embodiment 4.

FIG. 19 is a block diagram illustrating communication equipment according to Embodiment 4. The communication equipment illustrated in FIG. 19 includes an antenna 31, a duplexer 32, a transmitting-side signal processing part 33, a receiving-side signal processing part 34, a microphone 35, and a loudspeaker 36. The duplexer 32 has a filter 37 for transmission and a filter 38 for reception. The filter 38 for reception has a passing band (reception band) different from that of the filter 37 for transmission.

The microphone 35 converts a voice into a voice signal and sends the voice signal to the transmitting-side signal processing part 33. The transmitting-side signal processing part 33 modulates the voice signal to generate a transmission signal. The duplexer 32 sends the transmission signal sent from the transmitting-side signal processing part 33 to the antenna 31.

The antenna 31 converts the transmission signal into a radio wave and outputs it. Further, the antenna 31 converts the radio wave into an electric signal (reception signal) and sends the electric signal (reception signal) to the duplexer 32. In the duplexer 32, the filter 38 for reception passes the reception signal in a reception band and sends the passed reception signal to the receiving-side signal processing part 34. On the other hand, the filter 37 for transmission has a passing band different from the reception band, and hence, does not pass the reception signal. Thus, the reception signal is not input to the transmitting-side signal processing part 33. The receiving-side signal processing part 34 performs processing such as detection and amplification with respect to the reception signal, and generates a voice signal. The loudspeaker 36 converts the voice signal into a voice and outputs the voice.

Figure 20:
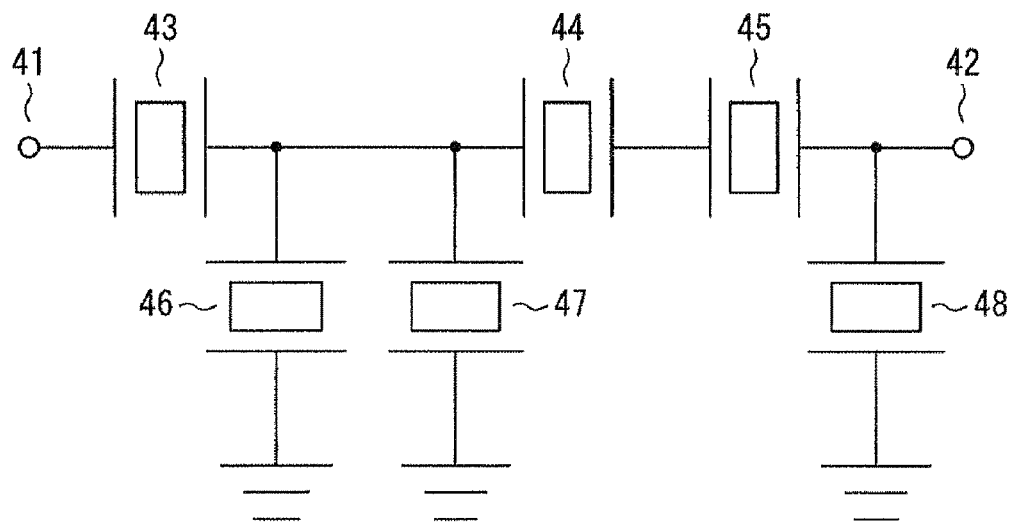
FIG. 20 is a circuit diagram of a filter used in the communication equipment according to Embodiment 4.

FIG. 20 is a circuit diagram of a ladder-type filter. The ladder-type filter is an example of the filter 37 for transmission or the filter 38 for reception. As illustrated in FIG. 20, resonators 43, 44, and 45 are connected in series to a series arm connected between an input terminal 41 and an output terminal 42. The resonators 46, 47 are connected to a parallel arm connected between the resonators 43 and 44. The resonator 48 is connected to a parallel arm connected between the resonator 45 and the output terminal 42. One end of the parallel arm is connected to the series arm and the other end thereof is grounded.

In the filter illustrated in FIG. 20, the resonators 43 to 48 are those which are illustrated in Embodiments 1 to 3. Thus, an unnecessary response generated in a band except for the passing band of the filter is small. Thus, for example, the amount of the reception signal from the antenna 31 is reduced, which leaks from the filter 37 for transmission and is input to the transmitting-side signal processing part 33.

The configuration in which the communication equipment includes the microphone 35 and the loudspeaker 36 has been described; however, the communication equipment is not limited to this configuration. For example, the communication equipment may be the one that does not include the microphone 35 or the loudspeaker 36 as in a personal computer, and equipment capable of transmitting/receiving data other than voice data.

The boundary acoustic waves device of the present application is applicable to a filter of communication equipment.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention(s) has (have) been described in detail, it should be understood that the various changes, substitutions, and alterations could be made hereto without departing from the spirit and scope of the invention.

The invention claimed is:
1. A boundary acoustic waves device comprising:
a piezoelectric substrate having piezoelectricity;
an interdigitated electrode formed on the piezoelectric substrate;
a first medium formed on the piezoelectric substrate so as to cover the interdigitated electrode; and
a second medium formed on the first medium,
the interdigitated electrode having a plurality of electrode fingers and a bus bar that connects ends of the plurality of electrode fingers, wherein the boundary acoustic waves device includes a third medium formed on the first medium, the second medium and the third medium are in contact with the first medium, the first medium, the second medium, and the third medium respectively are formed of different materials, and a ratio in length of a part with the third medium formed with respect to a length of a propagation path of boundary acoustic waves in a cross-section perpendicular to a longitudinal direction of the electrode fingers varies in the longitudinal direction of the electrode fingers, wherein the first medium is divided into halves in a direction perpendicular to the longitudinal direction of the electrode fingers, as a region on which the third medium is formed and a region on which the third medium is not formed, and wherein the third medium is formed of at least two media that are formed of different materials.

2. A filter comprising a double-mode resonator,
the double-mode resonator comprising:
a piezoelectric substrate having piezoelectricity;
an interdigitated electrode formed on the piezoelectric substrate;
a first medium formed on the piezoelectric substrate so as to cover the interdigitated electrode;
a second medium formed on the first medium; and
a third medium formed on the first medium,
wherein the interdigitated electrode has a plurality of electrode fingers and a bus bar that connects ends of the plurality of electrode fingers,
the second medium and the third medium are in contact with the first medium,
the first medium, the second medium, and the third medium respectively are formed of different materials, and
a ratio in length of a part with the third medium formed with respect to a length of a propagation path of boundary acoustic waves in a cross-section perpendicular to a longitudinal direction of the electrode fingers varies in the longitudinal direction of the electrode fingers, and
wherein the first medium is divided into halves in a direction perpendicular to the longitudinal direction of the electrode fingers, as a region on which the third medium is formed and a region on which the third medium is not formed.

3. A boundary acoustic waves device, comprising:
a piezoelectric substrate having piezoelectricity;
an interdigitated electrode formed on the piezoelectric substrate;
a first medium formed on the piezoelectric substrate so as to cover the interdigitated electrode; and
a second medium formed on the first medium, the interdigitated electrode having a plurality of electrode fingers and a bus bar that connects ends of the plurality of electrode fingers,
wherein the boundary acoustic waves device includes a third medium formed on the first medium,
the second medium and the third medium are in contact with the first medium,
the first medium, the second medium, and the third medium respectively are formed of different materials, and
a ratio in length of a part with the third medium formed with respect to a length of a propagation path of boundary acoustic waves in a cross-section perpendicular to a longitudinal direction of the electrode fingers varies in the longitudinal direction of the electrode fingers, and
wherein the first medium is divided into halves in a direction perpendicular to the longitudinal direction of the electrode fingers, as a region on which the third medium is formed and a region on which the third medium is not formed.

4. The boundary acoustic waves device according to claim 3, wherein the third medium is formed in a plural number.

5. The boundary acoustic waves device according to claim 3, wherein the ratio in length of the part with the third medium formed with respect to the length of the propagation path of the boundary acoustic waves in the cross-section perpendicular to the longitudinal direction of the electrode fingers varies continuously in the longitudinal direction of the electrode fingers.

6. The boundary acoustic waves device according to claim 3, wherein the third medium is formed of a material different from that of the second medium in a propagation speed of an acoustic wave.

7. The boundary acoustic waves device according to claim 3, wherein the first medium is $SiO_2$, and the third medium is alumina or SiN.

8. The boundary acoustic waves device according to claim 3, wherein the piezoelectric substrate is $LiTaO_3$ or $LiNbO_3$.

9. A filter comprising a one-port resonator,
the one-port resonator comprising:
a piezoelectric substrate having piezoelectricity;
an interdigitated electrode formed on the piezoelectric substrate;
a first medium formed on the piezoelectric substrate so as to cover the interdigitated electrode;
a second medium formed on the first medium; and
a third medium formed on the first medium,
wherein the interdigitated electrode has a plurality of electrode fingers and a bus bar that connects ends of the plurality of electrode fingers,
the second medium and the third medium are in contact with the first medium,
the first medium, the second medium, and the third medium respectively are formed of different materials, and
a ratio in length of a part with the third medium formed with respect to a length of a propagation path of boundary acoustic waves in a cross-section perpendicular to a longitudinal direction of the electrode fingers varies in the longitudinal direction of the electrode fingers, and
wherein the first medium is divided into halves in a direction perpendicular to the longitudinal direction of the electrode fingers, as a region on which the third medium is formed and a region on which the third medium is not formed.

10. A duplexer, comprising:
a filter for transmission; and
a filter for reception having a passing frequency band different from that of the filter for transmission,
wherein at least one of the filter for transmission and the filter for reception is the filter according to claim 9.

11. Communication equipment, comprising:
an antenna;
the duplexer according to claim 10 connected to the antenna; and
a signal processing part connected to the duplexer.

* * * * *